(12) United States Patent
Bednorz et al.

(10) Patent No.: US 12,724,056 B2
(45) Date of Patent: Sep. 1, 2026

(54) TEST AND/OR MEASUREMENT SYSTEM AND METHOD

(71) Applicant: Rohde & Schwarz GmbH & Co. KG, Munich (DE)

(72) Inventors: Thilo Bednorz, Munich (DE); Walter Weiss, Munich (DE); Markus Freidhof, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 167 days.

(21) Appl. No.: 18/883,607

(22) Filed: Sep. 12, 2024

(65) Prior Publication Data

US 2026/0072068 A1 Mar. 12, 2026

(51) Int. Cl.
*G01R 29/26* (2006.01)
*G01R 27/28* (2006.01)
*G01R 29/08* (2006.01)

(52) U.S. Cl.
CPC ............. *G01R 29/26* (2013.01); *G01R 27/28* (2013.01); *G01R 29/0871* (2013.01)

(58) Field of Classification Search
CPC . G06F 13/4068; G06F 18/2131; G01R 27/28; G01R 29/0871; G01R 29/26; H01R 13/66; H01R 31/005; H04B 1/1027; H04B 1/10; H04B 1/525; H04B 2201/70715; H04B 1/1036; H04B 1/0475; H04B 17/346; H04B 2203/5425; H04B 10/697; H04B 15/00
See application file for complete search history.

(56) References Cited

U.S. PATENT DOCUMENTS 5,191,294 A * 3/1993 Grace .................... G01R 29/26 324/613
6,714,898 B1 * 3/2004 Kapetanic .............. G01R 29/26 702/191
11,747,384 B2 * 9/2023 Boglione ............... G01R 29/26 324/613
2023/0280373 A1 9/2023 Ramian

* cited by examiner

*Primary Examiner* — Vinh P Nguyen
(74) *Attorney, Agent, or Firm* — CHRISTENSEN O'CONNOR JOHNSON KINDNESS PLLC

(57) ABSTRACT

A system includes a noise circuit, a first port, a second port, a receiver circuit, and a processing circuit. The noise circuit is configured to generate a noise signal having a frequency spectrum that extends over a predetermined frequency band of interest. The noise circuit is connected to the first port. The first port is connectable to a first DUT port. The second port is connectable to a second DUT port and receives a test signal from the DUT. The receiver circuit is connected to the second port for receiving the test signal. The receiver circuit is configured to digitize the test signal. The processing circuit is configured to transform the digitized test signal into frequency domain, having a plurality of frequency bins. The processing circuit is configured to determine a signal power of the transformed test signal for at least two frequency bins simultaneously.

22 Claims, 6 Drawing Sheets

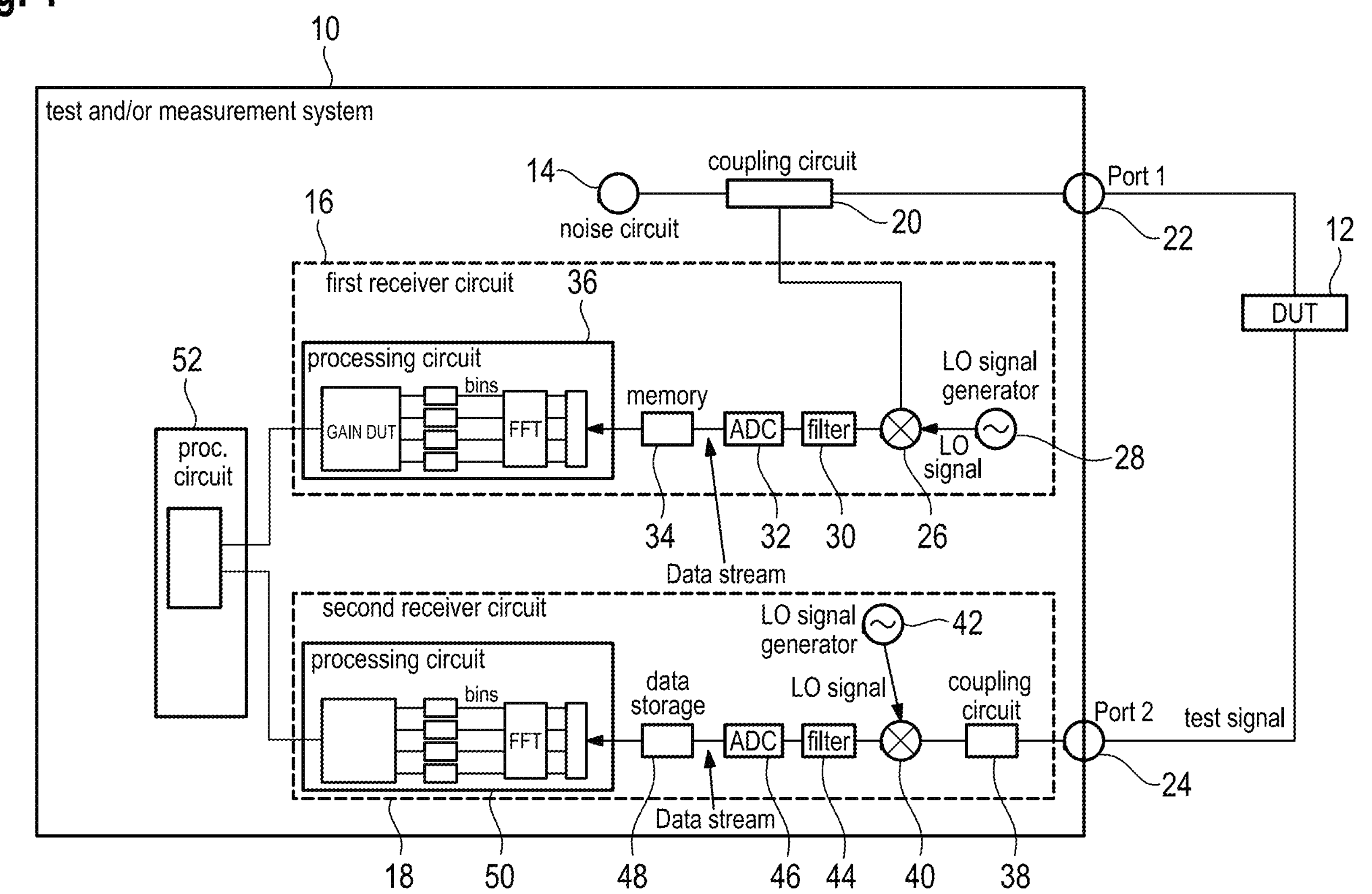
Fig. 1
10
test and/or measurement system
14
noise circuit
coupling circuit
20
Port 1
22
12
DUT
16
first receiver circuit
36
processing circuit
bins
GAIN DUT
FFT
memory
ADC
filter
LO signal generator
LO signal
28
34
32
30
26
Data stream
52
proc. circuit
second receiver circuit
LO signal generator
42
processing circuit
bins
FFT
data storage
ADC
filter
LO signal
coupling circuit
Port 2
test signal
24
Data stream
18
50
48
46
44
40
38

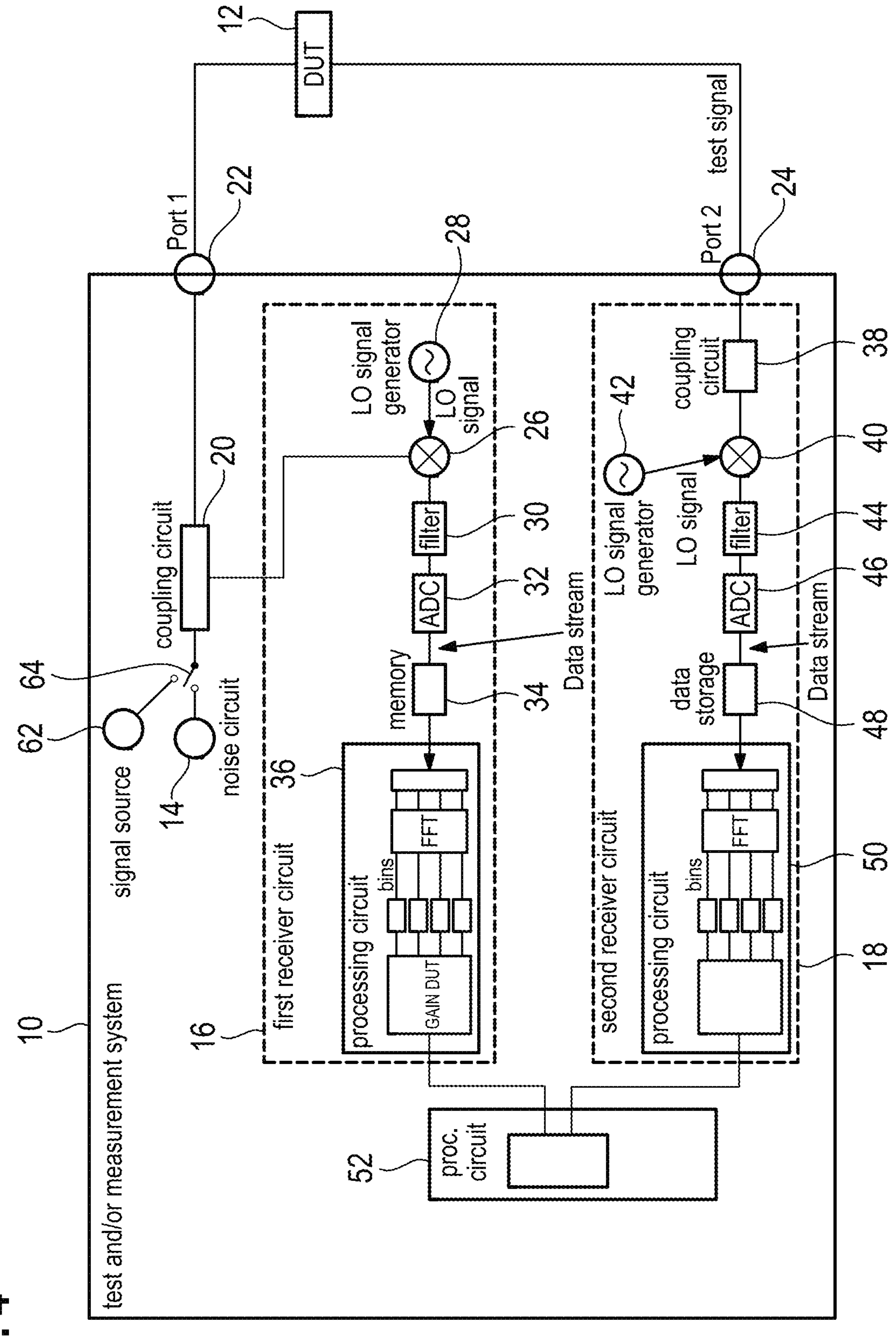
Fig. 4
10
test and/or measurement system
12
DUT
22
Port 1
24
Port 2
test signal
20
coupling circuit
64
62
signal source
14
noise circuit
16
first receiver circuit
28
LO signal generator
LO signal
26
30
filter
32
ADC
Data stream
34
memory
36
processing circuit
FFT
bins
GAIN DUT
18
second receiver circuit
38
coupling circuit
42
LO signal generator
LO signal
40
44
filter
46
ADC
Data stream
48
data storage
50
processing circuit
FFT
bins
52
proc. circuit

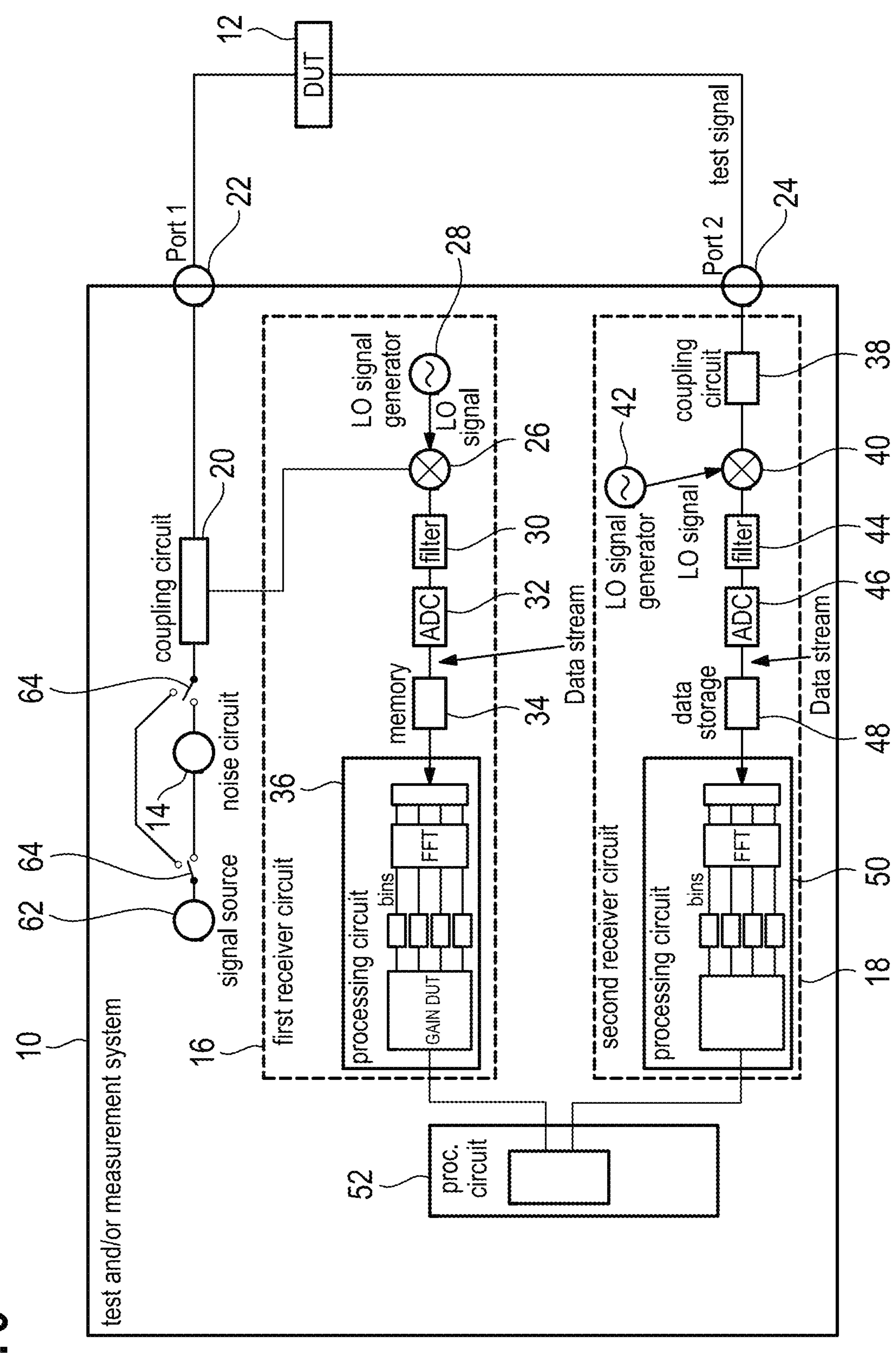
Fig. 5
test and/or measurement system
10
DUT
12
Port 1
22
Port 2
24
test signal
coupling circuit
20
64
62
signal source
noise circuit
14
first receiver circuit
16
LO signal generator
28
LO signal
26
filter
30
ADC
32
memory
34
Data stream
processing circuit
36
FFT
bins
GAIN DUT
second receiver circuit
18
coupling circuit
38
40
LO signal generator
42
LO signal
filter
44
ADC
46
data storage
48
Data stream
processing circuit
50
proc. circuit
52

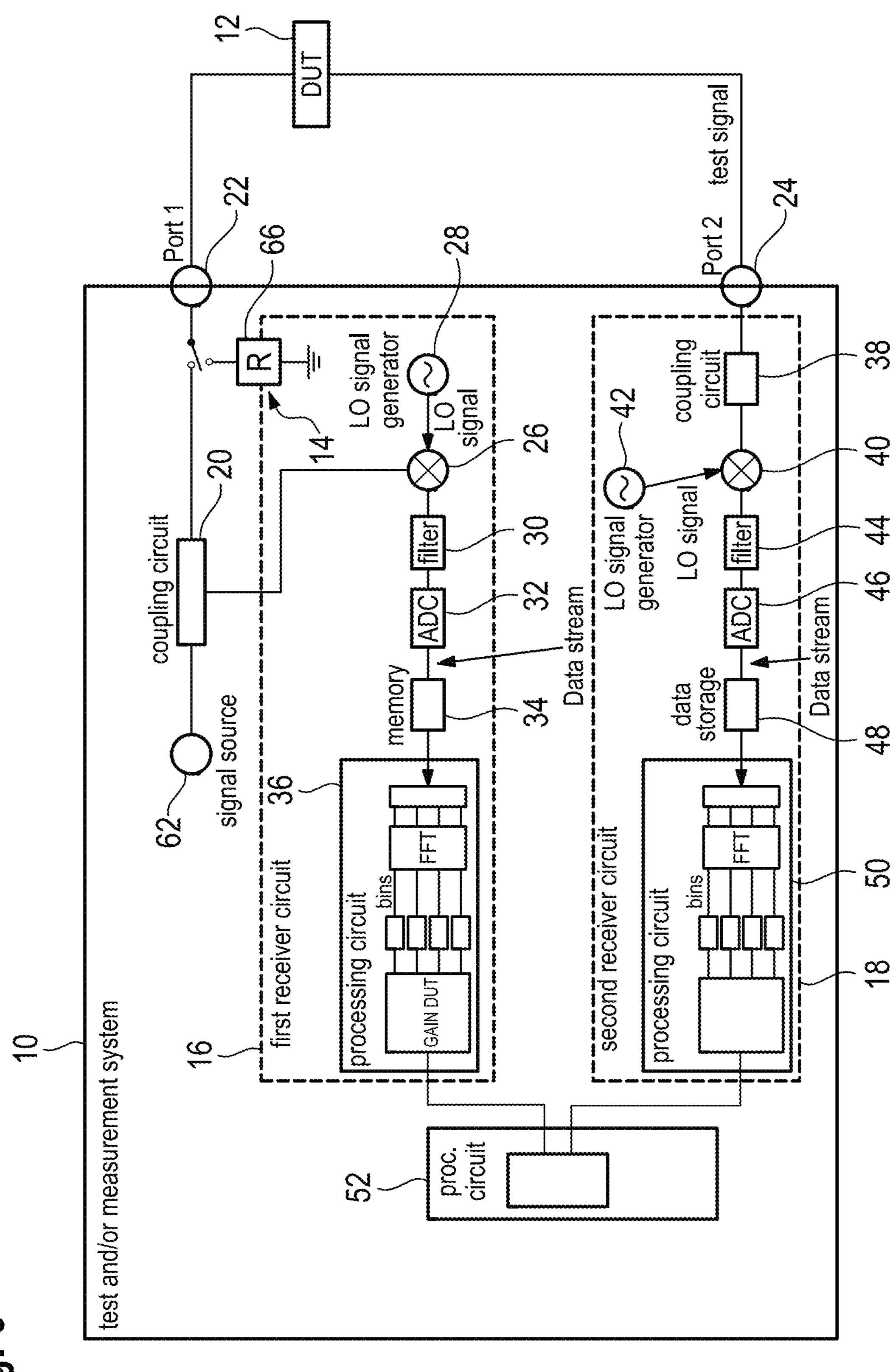
Fig. 6
10
test and/or measurement system
12
DUT
22
Port 1
24
Port 2
test signal
66
R
14
62
signal source
20
coupling circuit
28
LO signal generator
LO signal
26
30
filter
32
ADC
Data stream
34
memory
16
first receiver circuit
36
processing circuit
FFT
bins
GAIN DUT
38
coupling circuit
42
LO signal generator
LO signal
40
44
filter
46
ADC
Data stream
48
data storage
18
second receiver circuit
50
processing circuit
FFT
bins
52
proc. circuit

TEST AND/OR MEASUREMENT SYSTEM AND METHOD

FIELD OF THE DISCLOSURE

Embodiments of the present disclosure generally relate to a test and/or measurement system. Embodiments of the present disclosure further relate to a test and/or measurement method of testing a device under test.

BACKGROUND

Noise measurements on a device under test are usually performed by sweeping a receiver across a frequency band of interest, wherein the noise generated by the device under test is measured at every frequency point in a sequent manner.

Due to the typically low power level of the noise generated by the device under test, these measurements typically take a rather long time, especially if the frequency range to be tested is large.

Thus, there is a need for a test and/or measurement system as well as for a test and/or measurement method that allow for a more time-efficient measurement of noise generated by a device under test.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement system. In an embodiment, the test and/or measurement system comprises a noise circuit, a first port, a second port, at least one receiver circuit, and at least one processing circuit. The noise circuit is configured to generate a noise signal having a frequency spectrum that extends over a predetermined frequency band of interest. The noise circuit is connected to the first port, wherein the first port is connectable to a first DUT port of a device under test such that the noise signal is feedable to the device under test. The second port is connectable to a second DUT port of the device under test so as to receive a test signal from the device under test. The at least one receiver circuit is connected to the second port so as to receive the test signal. The at least one receiver circuit is configured to digitize the test signal, thereby obtaining a digitized test signal. The at least one processing circuit is configured to transform the digitized test signal into frequency domain, thereby obtaining a transformed test signal having a plurality of frequency bins. The at least one processing circuit is configured to determine a signal power of the transformed test signal for at least two frequency bins of the plurality of frequency bins simultaneously.

The term "connected" is understood to denote an immediate connection or a mediate connection between the respective components. For example, the respective components may be connected via a conductor and/or via an electromagnetic coupling.

The test and/or measurement system according to embodiments of the present disclosure is based on the idea to determine the noise generated by the device under test for at least two frequency bins simultaneously.

This is achieved by the receiver circuit being configured to process and digitize the test signal with a bandwidth that is sufficient in order to determine the signal power of the transformed test signal for the at least two frequency bins simultaneously.

Accordingly, the receiver circuit may be established as a broadband receiver circuit, i.e. as a receiver circuit that is configured to process and digitize the test signal over a bandwidth that covers the frequency band of interest at least partially, for example completely.

In an embodiment, the test signal corresponds to the noise signal processed by the device under test. Accordingly, the test signal comprises the noise signal being modified according to a transfer function of the device under test as well as noise generated by the device under test itself.

Therein, the power level of the noise signal is known. In an embodiment, the power level of the noise signal may be previously known and/or may be determined in a separate measurement.

Based on the known noise signal and based on the transform test signal, a noise power level of noise generated by the device under test can be determined. The determined noise level may in turn be used in order to determine a noise characteristic of the device under test, such as a noise figure of the device under test.

As the signal power of the transformed test signal is determined for at least two frequency bins simultaneously instead of for each frequency bin consecutively, the measurement time necessary in order to determine the noise generated by the device under test is reduced significantly compared to the state-of-the-art.

If the device under test has more than one output port, i.e. at least two second DUT ports, the measurements described above and hereinafter may be performed simultaneously for the at least two second DUT ports.

In an embodiment, the test and/or measurement system may comprise at least two receiver circuits, wherein each receiver circuit is connected to one of the at least two second DUT ports.

According to an aspect of the present disclosure, the digitized test signal, for example, is a data stream. In an embodiment, the test signal may be received and digitized by the at least one receiver circuit continuously, thereby generating the digitized test signal being a continuous data stream.

In an embodiment, the test and/or measurement system according to the present disclosure may be established as or comprise a vector network analyzer, a spectrum analyzer, and/or any other suitable type of test and/or measurement instrument.

According to an aspect of the present disclosure, the at least one processing circuit, for example, is configured to subtract, for each of the at least two frequency bins, a signal power of the noise signal from the determined signal power of the transformed test signal. By subtracting the signal power of the noise signal from the determined signal power of the transform test signal, a noise power level of the noise generated by the device under test can be determined for each of the at least two frequency bins.

In an embodiment, the at least one receiver circuit is configured to digitize the noise signal, thereby obtaining a digitized noise signal, wherein the at least one processing circuit is configured to transform the digitized noise signal into frequency domain, thereby obtaining a transformed noise signal having a plurality of frequency bins, and wherein the at least one processing circuit is configured to determine a signal power of the transformed noise signal for the at least two frequency bins of the plurality of frequency bins simultaneously. Accordingly, a signal power of the noise signal may be determined in a separate measurement, for example in a separate calibration measurement that is performed in order to calibrate the test and/or measurement system according to the present disclosure.

In an embodiment, the at least one receiver circuit may comprise a first receiver circuit and a second receiver circuit. The first receiver circuit may be configured to digitize the noise signal, while the second receiver circuit may be configured to digitize the test signal. In this case, both measurements may be performed simultaneously.

However, it is also conceivable that the at least one receiver circuit comprises a single receiver circuit that is configured to digitize both the noise signal and the test signal. In this case, the calibration measurement, i.e. determining the signal power of the transformed noise signal, and the measurements on the test signal may be performed consecutively.

In an embodiment, the test and/or measurement system may further comprise a coupling circuit, wherein the coupling circuit is interconnected between the noise circuit and the first port, wherein the coupling circuit further is connected to the at least one receiver circuit, and wherein the coupling circuit is configured to forward the noise signal to both the first port and to the at least one receiver circuit.

In an embodiment, the coupling circuit may comprise an electrical connection connecting the noise circuit and the first port. The coupling circuit may further be configured to couple the noise signal out of the electrical connection towards the at least one receiver circuit, for example by means of an electromagnetic coupling.

Alternatively, the coupling circuit may comprise an electrical connection connecting the noise circuit and the at least one receiver circuit. In this case, the coupling circuit may further be configured to couple the noise signal out of the electrical connection towards the first port, for example by an electromagnetic coupling. For example, the coupling circuit may be established as a directional coupler.

In an embodiment, the test and/or measurement system may further comprise a memory, wherein a signal power of the noise signal for the plurality of frequency bins is saved in the memory. In an embodiment, the signal power of the noise signal may be saved in the memory permanently or may be renewed in certain time intervals, for example periodically. For example, the signal power of the noise signal stored in the memory may be renewed during calibration measurements that may be performed in certain time intervals, for example periodically.

In an embodiment, the signal power of the noise signal may be loaded from said memory by the processing circuit for further processing as described above.

According to another aspect of the present disclosure, the at least one receiver circuit, for example, is a broadband receiver circuit such that the digitized test signal has a frequency spectrum extending over the frequency band of interest at least partially. Therein, the term "at least partially" is understood to denote that the frequency spectrum of the digitized test signal extends over at least two frequency bins, for example over a certain proportion of the frequency band of interest. Accordingly, the measurement time necessary for determining the noise generated by the device under test is reduced significantly, as the noise power level of the noise generated by the device under test can be determined for a significant portion of the frequency band of interest simultaneously. For example, the certain proportion may be 5%, 10%, 25%, 50%, 75% or any other value in between or above.

In an embodiment, the frequency spectrum of the digitized test signal may extend over the complete frequency band of interest, such that the noise generated by the device under test can be determined for the complete frequency band of interest simultaneously, thereby significantly reducing the measurement time necessary for determining the noise power level of the noise generated by the device under test.

In another embodiment, the at least one processing circuit is configured to determine a signal power of the transformed test signal for at least a portion of the plurality of frequency bins simultaneously, wherein the portion of the plurality of frequency bins extend over the frequency band of interest at least partially. Therein, the term "at least partially" is understood to denote that the portion of the plurality of frequency bins extends over at least two frequency bins, for example over a certain proportion of the frequency band of interest. Accordingly, the measurement time necessary for determining the noise generated by the device under test is reduced significantly, as the noise power level of the noise generated by the device under test can be determined for a significant portion of the frequency band of interest simultaneously. For example, the certain proportion may be 5%, 10%, 25%, 50%, 75% or any other value in between or above.

In an embodiment, the portion of the plurality of frequency bins may extend over the complete frequency band of interest, such that the noise generated by the device under test can be determined for the complete frequency band of interest simultaneously, thereby significantly reducing the measurement time necessary.

An aspect of the present disclosure provides that the receiver circuit, for example, is tunable to different portions of the frequency band of interest. Accordingly, the signal power of the transformed test signal, the signal power of the noise signal, and/or the noise generated by the device under test may be determined for the different portions of the frequency band of interest consecutively. While still reducing the measurement time necessary for determining the noise generated by the device under test, this allows for using a receiver circuit having a lower bandwidth, which reduces the manufacturing costs of the test and/or measurement system.

In another embodiment, the at least one receiver circuit comprises a mixing circuit, wherein the mixing circuit is configured to mix the test signal with a local oscillator signal, thereby converting the test signal to an intermediate frequency (IF). For example, the mixing circuit may be configured to mix the test signal with the local oscillator signal such that the test signal is converted to a certain IF band. This ensures reduced signal losses downstream of the mixing circuit, as well as efficient processing of the test signal downstream of the mixing circuit.

In an embodiment, the at least one receiver circuit may comprise a further mixing circuit, wherein the further mixing circuit is configured to mix the noise signal with a local oscillator signal, thereby converting the noise signal to an intermediate frequency (IF). For example, the further mixing circuit may be configured to mix the noise signal with the local oscillator signal such that the noise signal is converted to a certain IF band. This ensures reduced signal losses downstream of the further mixing circuit, as well as efficient processing of the noise signal downstream of the further mixing circuit.

In an embodiment, the at least one receiver circuit may comprise at least one filter circuit that is connected to the mixing circuit downstream of the mixing circuit. By the at least one filter circuit, undesired frequency ranges of the test signal and/or the nice signal mixed with the local oscillator signal can be reliably rejected.

A further aspect of the present disclosure provides that the at least one receiver circuit, for example, comprises at least one analog-to-digital converter (ADC) wherein the at least one ADC is configured to digitize the test signal, wherein the at least one ADC is connected to the second port, wherein a signal path between the second port and the at least one ADC comprises a mixing circuit or is free of a mixing circuit.

In an embodiment, if the signal path between the second port and the at least one ADC is free of a mixing circuit, the at least one ADC may be a broadband ADC, such that a broadband digitization of the test signal is performed.

In an embodiment, if a bandwidth of the test signal is larger than the bandwidth of the test signal, the mixing circuit may be provided in order to convert the test signal into an operating bandwidth of the at least one ADC.

In an embodiment, the test and/or measurement system may further comprise a data storage circuit, wherein the data storage circuit is connected to the at least one ADC, and wherein the data storage circuit is configured to store the digitized test signal. Thus, post-processing of the digitized test signal may be performed, such that there is no need to perform the measurements described above in real-time.

According to another aspect of the present disclosure, the processing circuit, for example, is configure to load the digitized test signal from the data storage circuit.

In an embodiment, the processing circuit is configured to weight the digitized test signal with a window function. In an embodiment, the window function may be a window function in time domain, such that a certain time slice of the digitized test signal is selected by the window function.

In an embodiment, the processing circuit may be configured to transform the digitized test signal weighted with the window function into frequency domain, thereby obtaining the transformed test signal.

In an embodiment, the window function may correspond to an impulse response of a resolution filter, wherein a bandwidth of the resolution filter determines a length of the transformation into frequency domain, for example a length of the corresponding Fast Fourier Transform.

In an embodiment, the processing circuit may be configured to determine a squared magnitude for each of the at least two frequency bins of the transformed test signal, thereby obtaining the signal power. In an embodiment, the squared magnitude of the transform test signal may be determined for each frequency bin separately.

A further aspect of the present disclosure provides that the plurality of frequency bins, for example, comprises interpolated frequency bins. In other words, the processing circuit may be configured to interpolate the transformed test signal such that the transformed test signal comprises frequency bins originating from the transformation into frequency domain as well as frequency bins originating from the interpolation. This way, a resolution for determining the signal power of the transformed test signal and/or a resolution for determining the noise power level of the noise generated by the device under test can be adapted.

In an embodiment, the frequency bins originating from the transformation into frequency domain and the frequency bins originating from the interpolation may alternate.

According to an aspect of the present disclosure, the at least one receiver circuit, for example, is configured to digitize the test signal repeatedly, wherein the processing circuit is configured to determine the signal power repeatedly, and wherein the processing circuit is configured to determine an average signal power corresponding to the signal power of the test signal averaged over time. Accordingly, an average noise power level of noise generated by the device under test may be determined by the processing circuit based on the average signal power determined.

According to another aspect of the present disclosure, the digitized test signal, for example, comprises IQ data relating to the test signal. Thus, the digitized test signal comprises both amplitude and phase information about the test signal.

In an embodiment, a signal path between the noise circuit and the first port may be free of an amplifier. Accordingly, the noise signal fed to the device under test is not amplified and/or distorted by any further amplifier. Moreover, there is no need to consider a gain applied to the noise signal by an amplifier when determining the noise generated by the device under test.

In an embodiment, the noise circuit is an active noise circuit or a passive noise circuit. In other words, the noise circuit may actively generate the noise signal, e.g. via a suitable signal generator. Alternatively or additionally, the noise circuit may generate the noise signal passively, i.e. without active signal generation.

For example, the noise circuit may comprise a signal generator, an attenuator, and or a resistor having a predefined resistance. Accordingly, the signal generator of the noise circuit may generate the noise signal actively. The attenuator may attenuate an RF signal generated or received by another circuit with a large attenuation factor, such as 50 dB or higher. The resistor passively generates a predefined thermal noise signal that depends on the temperature of the resistor.

Embodiments of the present disclosure further provide a test and/or measurement method of testing a device under test. In an embodiment, the test and/or measurement method comprises:

- generating, by a noise circuit, a noise signal, wherein the noise signal has a frequency spectrum that extends over a predetermined frequency band of interest;
- feeding, via a first port, the noise signal to a device under test;
- receiving, by a second port, a test signal corresponding to the noise signal from the device under test;
- digitizing, by at least one receiver circuit, the test signal, thereby obtaining a digitized test signal;
- transforming, by at least one processing circuit, the digitized test signal into frequency domain, thereby obtaining a transformed test signal having a plurality of frequency bins; and
- determining, by the at least one processing circuit, a signal power of the transformed test signal for at least two frequency bins of the plurality of frequency bins simultaneously.

In an embodiment, the test and/or measurement system according to any one of the embodiments described above may be configured to perform the test and/or measurement method.

Regarding the further advantages and properties of the test and/or measurement method, reference is made to the explanations given above with respect to the test and/or measurement system, which also hold for the test and/or measurement method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 schematically shows a test and/or measurement system according to an embodiment of the present disclosure;

FIG. 4 schematically shows another embodiment of the test and/or measurement system of FIG. 1;

FIG. 5 schematically shows another embodiment of the test and/or measurement system of FIG. 1; and FIG. 6 schematically shows another embodiment of the test and/or measurement system of FIG. 1.

DETAILED DESCRIPTION

Figure 2:
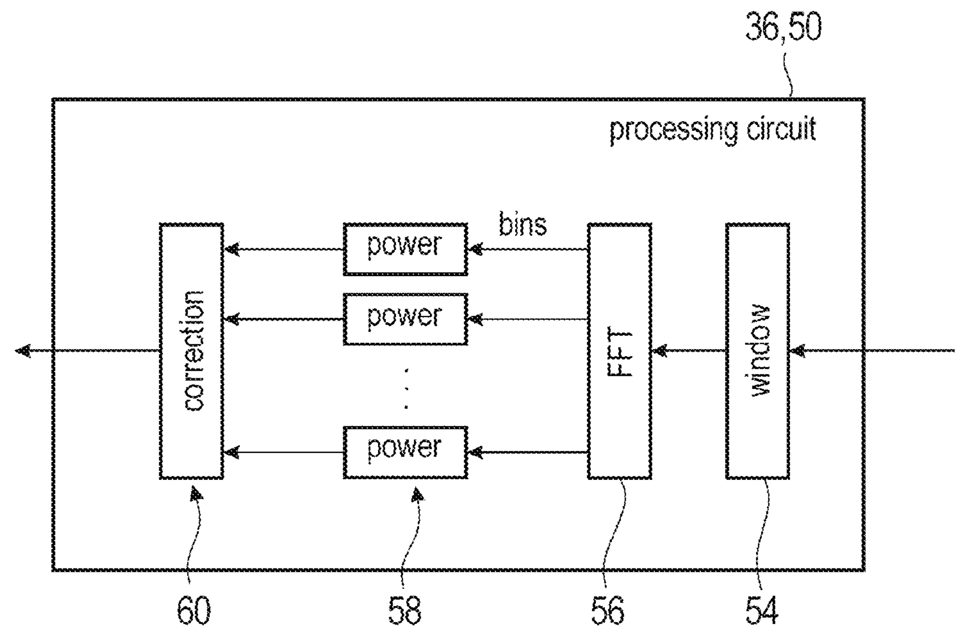
FIG. 2 schematically shows an example of a processing circuit of the test and/or measurement system of FIG. 1.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

FIG. 1 schematically shows an example embodiment of a test and/or measurement system 10 being configured to perform tests and/or measurements on a device under test 12. In general, the device under test 12 is an electronic device that is configured to receive and process an input signal, thereby obtaining an output signal. For example, the device under test 12 may be or comprise an amplifier, a mixer, a filter, or other electronic components or devices.

In an embodiment, the test and/or measurement system 10 may be established as or comprise a vector network analyzer (VNA) or as a spectrum analyzer. However, it is to be understood that the test and/or measurement system 10 may be established as or comprise any other suitable type of test and/or measurement instrument(s) being configured to perform the functionalities described below. For example, the test and/or measurement system 10 may be or comprise a more transmitters and/or receivers compared to the embodiments exemplarily described hereinafter.

In a certain example, the test and/or measurement system 10 may be or comprise an N-gate vector network analyzer being configured to measure all S-parameters of the device under test 12.

In the embodiment of FIG. 1, the test and/or measurement system 10 comprises a noise circuit 14, a first receiver circuit 16, and a second receiver circuit 18. In general, the noise circuit 14 is configured to generate a noise signal, wherein the noise signal has a frequency bandwidth that covers a frequency band of interest of the device under test 12 at least partially, for example completely. For example, the noise signal may comprise white noise, thermal noise, or any other type of noise that is suitable for performing tests on the device under test 12. Therein, the frequency band of interest is a frequency band of the device under test 12 that is to be tested.

In an embodiment, the noise circuit 14 may be established as or comprise a signal generator, for example an arbitrary waveform generator. In other words, the noise circuit 14 may be an active noise source. In another example, the noise circuit 14 may be a passive noise source, such as a resistor having a defined resistance and a certain temperature, or an attenuator that is connected to a signal source and applies a strong attenuation to a signal received from the signal source.

In an embodiment, the noise circuit 14, the first receiver circuit 16, and/or the second receiver circuit 18 may be integrated into the same test and/or measurement instrument, for example in a vector network analyzer or in a spectrum analyzer. Accordingly, the noise circuit 14, the first receiver circuit 16, and/or the second receiver circuit 18 may be enclosed by a common housing.

Alternatively, the noise circuit 14, the first receiver circuit 16, and/or the second receiver circuit 18 may be provided in different test and/or measurement instruments, and/or in different housings.

Downstream of the noise circuit 14, a coupling circuit 20 may be provided that connects the noise circuit 14 to a first port 22 of the test and/or measurement system 10 such that the noise signal generated by the noise circuit 14 is forwarded to the first port 22. The coupling circuit 20 may be also configured to forward the noise signal to the first receiver circuit 16. For example, the coupling circuit 20 may be established as a directional coupler. In an embodiment, the first port 22 is connected to a first DUT port of the device under test 12, for example to an input of the device under test 12.

In an embodiment, the test and/or measurement system 10 further comprises a second port 24 that is connected to a second DUT port of the device under test 12, for example to an output of the device under test 12. The second port 24 is connected to the second receiver circuit 18, such that an output signal of the device under test 12 is forwarded to the second receiver circuit 18 via the second port 24.

In the embodiment of FIG. 1, the first receiver circuit 16 comprises a first mixing circuit 26 that is connected to the coupling circuit 20 and to a local oscillator (LO) signal generator circuit 28. Downstream of the first mixing circuit 26, a first filter circuit 30 is provided. The first receiver circuit 16 also comprises at least one first ADC 32 that is connected to the first filter circuit 30 downstream of the first filter circuit 30. Optionally, a memory 34 may be provided downstream of the at least one first ADC 32. The first receiver circuit 16 further comprises a first processing circuit 36 that is connected to the at least one first ADC 32, for example to the memory 34 downstream of the at least one first ADC 32.

In the embodiment of FIG. 1, the second receiver circuit 18 may, optionally, comprise a coupling circuit 38 that is connected to the second port 24. Further, the second receiver circuit 18 may comprise a second mixing circuit 40 that is connected to the second port 24, for example via the coupling circuit 38. The second mixing circuit 40 is further connected to a further LO signal generator circuit 42. It is noted that is also conceivable that both the first mixing circuit 26 and the second mixing circuit 40 may be connected to a common LO signal generator. Downstream of the second mixing circuit 40, a second filter circuit 44 is provided.

In an embodiment, the second receiver circuit 18 further comprises at least one second ADC 46 that is connected to the second filter circuit 44 downstream of the second filter circuit 44. Optionally, a data storage circuit 48 may be provided downstream of the at least one second ADC 46.

In an embodiment, the second receiver circuit 18 further comprises a second processing circuit 50 that is connected to the at least one second ADC 46, for example to the data storage circuit 48, downstream of the at least one second ADC 46. It is noted that it is also conceivable that the first processing circuit 36 and the second processing circuit 50 may be integrated into a common processing circuit.

In the example embodiment shown in FIG. 1, the test and/or measurement system 10 further comprises a processing circuit 52 that is connected to both the first processing circuit 36 and the second processing circuit 50. However, it is to be understood that the first processing circuit 36, the second processing circuit 50, and/or the processing circuit 52 may be integrated into a common processing circuit.

FIG. 2 schematically shows the first processing circuit 36 in more detail. It is to be understood that the second processing circuit 50 may be established analogously to the first processing circuit 36.

In an embodiment, the first processing circuit 36 comprises a weighting sub-circuit 54 that is connected to the at least one first ADC 32 or to the memory 34. Downstream of the weighting sub-circuit 54, a FFT sub-circuit 56 is provided.

In an embodiment, the first processing circuit 36 further comprises a plurality of power sub-circuits 58 that are connected to the FFT sub-circuit 56 downstream of the FFT sub-circuit 56. The first processing circuit 36 may also comprise a correction sub-circuit 60 that is provided downstream of the power sub-circuits 58.

The functionality of the first processing circuit 36 and of the individual sub-circuits will be described in more detail below.

Figure 3:
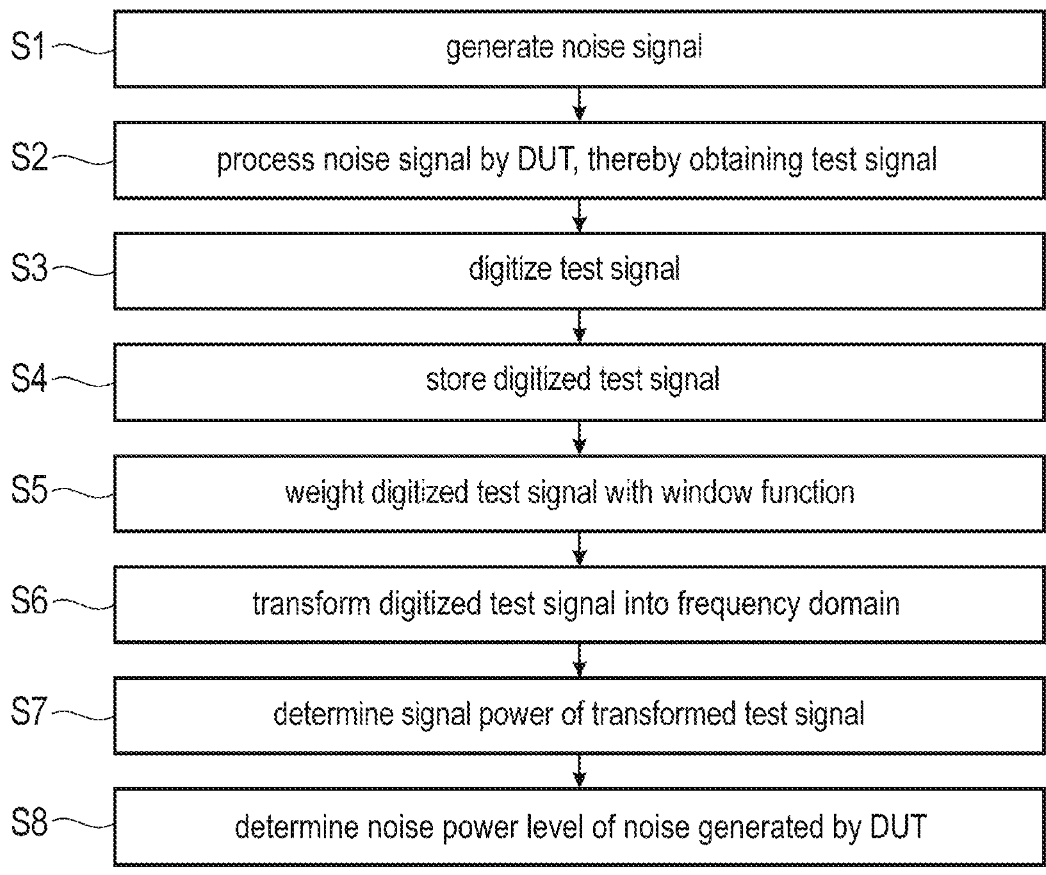
FIG. 3 shows an example of a flow chart of a test and/or measurement method according to an embodiment of the present disclosure.

Embodiments of the test and/or measurement system 10 described above are configured to perform a test and/or measurement method of testing the device under test 12, an example of which is described hereinafter with reference to FIG. 3.

The noise signal described above is generated by the noise circuit 14 (step S1).

The noise signal is forwarded to the device under test 12 via the coupling circuit 20 and the first port 22. Moreover, the noise signal may be forwarded to the first mixing circuit 26 via the coupling circuit 20.

The noise signal is processed by the device under test 12, thereby obtaining a test signal (step S2).

Accordingly, the test signal comprises the noise signal, but modified by a transfer function of the device under test 12. Moreover, the test signal comprises noise originating in the device under test 12, i.e. noise generated by the device under test 12 itself.

The test signal is forwarded to the second receiver circuit 18 via the second port 24. Optionally, the test signal is mixed, by the second mixing circuit 40, with a LO signal generated by the LO signal generator circuit 42, thereby converting the test signal to an intermediate frequency (IF) band. Further, the test signal may be filtered by the second filter circuit 44. It is to be understood that further signal-shaping circuits may be provided that perform further signal-shaping operations on the test signal, such as an amplifier that may amplify the test signal.

According to another embodiment, the second mixing circuit 40 and/or the second filter circuit 44 may be bypassed. In this case, the test signal may be forwarded from the second port 24 to the at least one second ADC 46 directly.

In an embodiment, up to a certain frequency or bandwidth threshold that corresponds to the bandwidth of the at least one second ADC 46, for example up to 9 GHZ, the second mixing circuit 40 and the filter circuit 44 may be bypassed. If the bandwidth of the test signal exceeds that threshold, the second mixing circuit 40 and the filter circuit 44 may be engaged.

The test signal is digitized by the at least one second ADC 46, thereby obtaining a digitized test signal (step S3).

In an embodiment, the test signal may be received and digitized continuously, such that the digitized test signal is a digital data stream. Therein, the digitized test signal may comprise IQ data relating to the test signal, such that the digitized test signal comprises both amplitude and phase information on the test signal. The at least one second ADC 46 has a certain bandwidth that covers a certain portion of the frequency range of interest.

According to an embodiment, the bandwidth of the at least one second ADC 46 may cover the complete frequency range of interest. In this case, the digitization of the test signal can be performed over the complete frequency range of interest simultaneously. Thus, the measurements described hereinafter may be performed for the complete frequency range of interest simultaneously.

If the bandwidth of the at least one second ADC 46 does not cover the complete frequency range of interest, the second receiver circuit 18 may consecutively tune itself to different portions of the frequency range of interest. Thus, the test signal may be digitized over several portions of the frequency range of interest consecutively, and the measurements described hereinafter may be performed for the different portions of the frequency range of interest consecutively.

The digitized test signal may be stored in the data storage circuit 48 (step S4).

In an embodiment, the second processing circuit 50 may load the digitized test signal from the data storage circuit 48 and may perform the steps described hereinafter in post-processing. However, it is also conceivable that the processing circuit 50 may receive the digitized test signal directly from the at least one second ADC 46, and may perform the steps described hereinafter in real time at least partially.

The digitized test signal may be weighted with a window function by the second processing circuit 50, for example by the weighting sub-circuit 54 (step S5).

The window function may be a window function in time domain, such that a certain time slice of the digitized test signal is selected by the window function. In an embodiment, the window function may correspond to an impulse response of a resolution filter, wherein a bandwidth of the resolution filter determines a length of a transformation into frequency domain described hereinafter, for example a length of the corresponding Fast Fourier Transform.

The digitized test signal is transformed into frequency domain by the second processing circuit 50, for example by the FFT sub-circuit 56, thereby obtaining a transformed test signal having a plurality of frequency bins (step S6).

For example, the FFT sub-circuit 56 may perform a Fast Fourier Transform (FFT) of the digitized test signal, thereby obtaining the transformed test signal. The plurality of frequency bins cover the frequency range of interest at least partially, for example completely.

If the plurality of frequency bins does not cover the frequency range of interest completely, the different portions of the frequency range of interest may be converted into frequency domain consecutively. Therein, the consecutive transformations may have a certain overlap in frequency domain in order to ensure that the consecutive transformations can be matched correctly.

In an embodiment, the second processing circuit 50 may be configured to interpolate the transformed test signal such that the transformed test signal comprises frequency bins originating from the transformation into frequency domain as well as frequency bins originating from the interpolation.

In an embodiment, the frequency bins originating from the transformation into frequency domain and the frequency bins originating from the interpolation may alternate.

A signal power of the transformed test signal is determined for at least two frequency bins simultaneously by the plurality of power sub-circuits 58 (step S7).

For example, the signal power of the transformed test signal may be determined by calculating, for each frequency bin, a squared magnitude of the transformed test signal. In an embodiment, the signal power may be determined for each frequency bin individually but simultaneously.

In an embodiment, the signal power of the transform test signal may be corrected for gain factors in the signal chain by the second signal processing circuit 50, for example by the correction sub-circuit 60.

In an embodiment, the correction sub-circuit may perform further corrections, such as compensating for an impedance mismatch of the device under test 12 and/or performing a cross-correlation averaging technique in order to reduce measurement errors and increase measurement sensitivity.

In an embodiment, the signal power determined is then forwarded to the processing circuit 52.

A noise power level of noise generated by the device under test 12 is determined by the processing circuit 52 based on the signal power of the transformed test signal determined by the second processing circuit 50 (step S8).

For example, the processing circuit 52 may subtract, for each frequency bin, a signal power of the noise signal generated by the noise circuit 14 from the determined signal power of the transformed test signal. Based on the determined noise power level of noise generated by the device under test 12, a noise characteristic of the device under test 12 may be determined, such as a noise figure.

In an embodiment, the noise figure F over frequency f of the device under test 12 may be determined according to $$F(f) = \frac{\frac{S_1(f)}{N_1(f)}}{\frac{S_1(f)\cdot G(f)}{N_2(f)}} = \frac{N_2(f)}{N_1(f)\cdot G(f)}.$$

Wherein $N_1$ (f) is the noise power level at the input of the device under test 12, i.e. the noise power level of the noise signal generated by the noise circuit 14, $N_2(f)$ is the noise power level at the output of the device under test 12 (measured as described above), and G(f) is a gain of the device under test 12, which may be determined in a separate measurement.

It is noted that in step S7, an average signal power corresponding to the signal power of the test signal averaged over time may be determined, and in step S8 an average noise power level corresponding to the noise power level averaged over time may be determined.

In an embodiment, the average may be a running average over a predetermined number of previous measurements.

In an embodiment, the processing circuit 52 may further be configured to correct the determined noise power level for certain errors, such as compensating for an impedance mismatch of the device under test 12 and/or performing a cross-correlation averaging technique in order to reduce measurement errors and increase measurement sensitivity.

For determining the noise generated by the device under test 12 in step S8, the signal power of the noise signal has to be known. For example, the signal power of the noise signal generated by the noise circuit 14 may be known from a previous calibration measurement and may be saved in the memory 34. In an embodiment, the corresponding calibration measurement may be performed repeatedly in certain time intervals, for example periodically. However, it is also conceivable that the signal power of the noise signal may be determined in parallel to the measurements performed on the test signal described above.

The corresponding calibration measurements and the corresponding parallel measurement are described hereinafter. In an embodiment, the measurements on the noise signal generated by the noise circuit 14 may be performed analogously to the measurements on the test signal described above.

In an embodiment, the noise signal generated by the noise circuit 14 is forwarded to the first mixing circuit 26 by the coupling circuit 20. The noise signal may be mixed with an LO signal generated by the LO signal generator circuit 28, thereby converting the noise signal to an IF band. The noise signal may then be filtered by the first filter circuit 30 and/or processed by other suitable signal-shaping circuits. The noise signal is digitized by the at least one first ADC 32, thereby obtaining a digitized noise signal.

In an embodiment, the digitized noise signal may comprise IQ data relating to the noise signal, such that the digitized noise signal comprises both amplitude and phase information on the test signal. In an embodiment, the digitized noise signal may be stored in the memory 34.

Before transformation into frequency domain, the digitized noise signal may be weighted with a corresponding window function.

In an embodiment, the first processing circuit 36 transforms the digitized noise signal into frequency domain, for example by an FFT, thereby obtaining a transformed noise signal having a plurality of frequency bins. The first processing circuit 36 may be configured to interpolate the transformed noise signal such that the transformed noise signal comprises frequency bins originating from the transformation into frequency domain as well as frequency bins originating from the interpolation. In an embodiment, the frequency bins originating from the transformation into frequency domain and the frequency bins originating from the interpolation may alternate.

In an embodiment, the first processing circuit 36 may load the digitized noise signal from the memory 34. Alternatively or additionally, the first processing circuit 36 may receive the digitized noise signal directly from the at least one first ADC 32.

In an embodiment, a signal power of the transformed noise signal may be determined for each of the frequency bins by the first processing circuit 36. For example, the signal power of the transformed noise signal may be determined by calculating, for each frequency bin, a squared magnitude of the transformed noise signal.

In an embodiment, the determined signal power of the transformed noise signal may be corrected for gain factors in the signal chain and/or for a gain factor of the device under test 12. The determined signal power of the transformed noise signal may then be forwarded to the processing circuit 52 and/or saved in the memory 34.

FIG. 4 schematically shows another embodiment of the test and/or measurement system 10. Hereinafter, only the differences compared to the embodiment of FIG. 1 will be explained.

As shown in FIG. 4, the test and/or measurement system 10 further comprises a signal source 62. In general, the signal source 62 is configures to generate or receive a radio frequency (RF) signal. In an embodiment, the RF signal may be a continuous wave signal. Accordingly, the signal source 62 may be continuous wave signal source.

The test and/or measurement system 10 may further comprise a switching circuit 64. In general, the switching circuit 64 is configured to selectively connect the noise circuit 14 or the signal source 62 to the first port 22 and/or to the first receiver circuit 16. In the example embodiment shown in FIG. 4, the switching circuit 64 is configured to selectively connect the noise circuit 14 or the signal source 62 to the coupling circuit 20.

With the noise circuit 14 connected to the first port 22 and/or the first receiver circuit 16, the measurements described above with reference to FIGS. 1-3 can be performed. With the signal source 62 connected to the first port 22 and/or the first receiver circuit 16, a further set of measurements can be performed, e.g. a measurement of a gain of the device under test 12.

FIG. 5 schematically shows another embodiment of the test and/or measurement system 10, wherein only the differences compared to the second embodiment described above with respect to FIG. 4 will be explained hereinafter. In this example embodiment, the switching circuit 64 is configured to selectively bypass the noise circuit 14 or interconnect the noise circuit 14 between the signal source 62 and the first port 22 and/or the first receiver circuit 16.

In an embodiment, the switching circuit 64 may be configured to selectively bypass the noise circuit 14 or interconnect the noise circuit 14 between the signal source 62 and the coupling circuit 20. In this example embodiment, the noise circuit 14 may be or comprise an attenuator that is configured to attenuate the RF signal, for example the CW signal, generated by the signal source 62. For example, the noise circuit 14 may be configured to attenuate the RF signal by 50 dB or more, such that essentially only noise remains from the RF signal generated by the signal source 62.

With the noise circuit 14 interconnected, the measurements described above with respect to FIGS. 1-3 can be performed. With the noise circuit 14 bypassed, a further set of measurements can be performed, e.g. a measurement of a gain of the device under test 12.

FIG. 6 schematically shows yet another embodiment of the test and/or measurement system 10, wherein only the differences compared to the second embodiment described above with respect to FIG. 4 will be explained hereinafter. In the embodiment of FIG. 6, the signal source 62 may be connected to the first receiver circuit 16 via the coupling circuit 20.

In the shown embodiment, the switching circuit 64 may be configured to selectively connect the signal source (via the coupling circuit 20) or the noise circuit 14 to the first port 22. Therein, the switching circuit 64 may be provided between the signal source 62 and the first port 22, for example between the coupling circuit 20 and the first port 22.

In an embodiment, the noise circuit 14 may comprise a resistor 66 that is connected to a reference potential, for example to a ground potential. In an embodiment, the resistor 66 has a predefined resistance, such as 50 Ohm. At a given temperature, the resistor 66 generates a predetermined thermal noise signal that can be forwarded to the device under test 12 via the first port 22. Accordingly, with the noise circuit 14 connected to the first port 22, the measurements described above with respect to FIGS. 1-3 can be performed.

However, in this case the noise signal is not forwarded to the first receiver circuit 16 for analysis. Instead, the signal power of the noise signal generated by the noise circuit 14 may be calculated based on the temperature and resistance of the resistor 66 instead of being measured by the first receiver circuit 16.

With the signal source 62 connected to the first port 22, a further set of measurements can be performed, e.g. a measurement of a gain of the device under test 12.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a graphics processing unit (GPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In an embodiment, one or more of the components, such as test and measurement system 10, the DUT 12, etc., referenced above include circuitry programmed to carry out one or more steps of any of the methods disclosed herein. In an embodiment, one or more computer-readable media associated with or accessible by such circuitry contains computer readable instructions embodied thereon that, when executed by such circuitry, cause the component or circuitry to perform one or more steps of any of the methods disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible by a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

It will be appreciated that in one or more embodiments, the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), a graphics processing unit (GPU) or the like, or any combinations thereof.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement system, wherein the test and/or measurement system comprises a noise circuit, a first port, a second port, at least one receiver circuit, and at least one processing circuit, wherein the noise circuit is configured to generate a noise signal, wherein the noise signal has a frequency spectrum that extends over a predetermined frequency band of interest, wherein the noise circuit is connected to the first port, and wherein the first port is connectable to a first DUT port of a device under test such that the noise signal is feedable to the device under test, wherein the second port is connectable to a second DUT port of the device under test so as to receive a test signal from the device under test, wherein the at least one receiver circuit is connected to the second port so as to receive the test signal, wherein the at least one receiver circuit is configured to digitize the test signal, thereby obtaining a digitized test signal, wherein the at least one processing circuit is configured to transform the digitized test signal into frequency domain, thereby obtaining a transformed test signal having a plurality of frequency bins, and wherein the at least one processing circuit is configured to determine a signal power of the transformed test signal for at least two frequency bins of the plurality of frequency bins simultaneously.

2. The test and/or measurement system of claim 1, wherein the at least one processing circuit is configured to subtract, for each of the at least two frequency bins, a signal power of the noise signal from the determined signal power of the transformed test signal.

3. The test and/or measurement system of claim 1, wherein the at least one receiver circuit is configured to digitize the noise signal, thereby obtaining a digitized noise signal, wherein the at least one processing circuit is configured to transform the digitized noise signal into frequency domain, thereby obtaining a transformed noise signal having a plurality of frequency bins, and wherein the at least one processing circuit is configured to determine a signal power of the transformed noise signal for the at least two frequency bins of the plurality of frequency bins simultaneously.

4. The test and/or measurement system of claim 3, further comprising a coupling circuit, wherein the coupling circuit is interconnected between the noise circuit and the first port, wherein the coupling circuit further is connected to the at least one receiver circuit, and wherein the coupling circuit is configured to forward the noise signal to both the first port and to the at least one receiver circuit.

5. The test and/or measurement system of claim 1, further comprising a memory, wherein a signal power of the noise signal for the plurality of frequency bins is saved in the memory.

6. The test and/or measurement system of claim 1, wherein the at least one receiver circuit is a broadband receiver circuit such that the digitized test signal has a frequency spectrum extending over the frequency band of interest at least partially.

7. The test and/or measurement system of claim 6, wherein the at least one processing circuit is configured to determine a signal power of the transformed test signal for at least a portion of the plurality of frequency bins simultaneously, wherein the portion of the plurality of frequency bins extend over the frequency band of interest at least partially.

8. The test and/or measurement system of claim 1, wherein the receiver circuit is tunable to different portions of the frequency band of interest.

9. The test and/or measurement system of claim 1, wherein the at least one receiver circuit comprises a mixing circuit, wherein the mixing circuit is configured to mix the test signal with a local oscillator signal, thereby converting the test signal to an intermediate frequency, IF.

10. The test and/or measurement system of claim 9, wherein the at least one receiver circuit comprises at least one filter circuit that is connected to the mixing circuit downstream of the mixing circuit.

11. The test and/or measurement system of claim 1, wherein the at least one receiver circuit comprises at least one analog-to-digital converter, ADC, wherein the at least one ADC is configured to digitize the test signal, wherein the at least one ADC is connected to the second port, wherein a signal path between the second port and the at least one ADC comprises a mixing circuit or is free of a mixing circuit.

12. The test and/or measurement system of claim 11, further comprising a data storage circuit, wherein the data storage circuit is connected to the at least one ADC, and wherein the data storage circuit is configured to store the digitized test signal.

13. The test and/or measurement system of claim 12, wherein the processing circuit is configure to load the digitized test signal from the data storage circuit.

14. The test and/or measurement system of claim 1, wherein the processing circuit is configured to weight the digitized test signal with a window function.

15. The test and/or measurement system of claim 1, wherein the processing circuit is configured to determine a squared magnitude for each of the at least two frequency bins of the transformed test signal, thereby obtaining the signal power.

16. The test and/or measurement system of claim 1, wherein the plurality of frequency bins comprises interpolated frequency bins.

17. The test and/or measurement system of claim 1, wherein the at least one receiver circuit is configured to digitize the test signal repeatedly, wherein the processing circuit is configured to determine the signal power repeatedly, and wherein the processing circuit is configured to determine an average signal power corresponding to the signal power of the test signal averaged over time.

18. The test and/or measurement system of claim 1, wherein the digitized test signal comprises IQ data relating to the test signal.

19. The test and/or measurement system of claim 1, wherein a signal path between the noise circuit and the first port is free of an amplifier.

20. The test and/or measurement system of claim 1, wherein the noise circuit is an active noise circuit or a passive noise circuit.

21. The test and/or measurement system of claim 1, wherein the noise circuit comprises a signal generator, an attenuator, and or a resistor having a predefined resistance.

22. A test and/or measurement method of testing a device under test, comprising:

generating, by a noise circuit, a noise signal, wherein the noise signal has a frequency spectrum that extends over a predetermined frequency band of interest;

feeding, via a first port, the noise signal to a device under test;

receiving, by a second port, a test signal corresponding to the noise signal from the device under test;

digitizing, by at least one receiver circuit, the test signal, thereby obtaining a digitized test signal;

transforming, by at least one processing circuit, the digitized test signal into frequency domain, thereby obtaining a transformed test signal having a plurality of frequency bins; and determining, by the at least one processing circuit, a signal power of the transformed test signal for at least two frequency bins of the plurality of frequency bins simultaneously.

* * * * *